United States Patent [19]
Elman et al.

[11] Patent Number: 5,238,868
[45] Date of Patent: Aug. 24, 1993

[54] BANDGAP TUNING OF SEMICONDUCTOR QUANTUM WELL STRUCTURES

[75] Inventors: Boris S. Elman, Newton; Emil S. Koteles, Lexington; Paul Melman, Newton; Craig A. Armiento, Acton, all of Mass.

[73] Assignee: GTE Laboratories Incorporated, Waltham, Mass.

[21] Appl. No.: 724,437

[22] Filed: Jul. 1, 1991

Related U.S. Application Data

[63] Continuation of Ser. No. 444,502, Nov. 30, 1989, abandoned.

[51] Int. Cl.$^5$ .................... H01L 21/20; H01L 21/203
[52] U.S. Cl. .................................. 437/126; 437/105; 437/107; 437/129; 437/133; 257/12; 257/14; 257/15; 372/7; 372/43
[58] Field of Search ....................... 372/43, 45, 46, 50; 357/16, 17, 19, 129, 133, 105, 107, 126

[56] References Cited

U.S. PATENT DOCUMENTS

| | | | |
|---|---|---|---|
| 4,511,408 | 4/1985 | Holonyak | 357/17 |
| 4,771,010 | 9/1988 | Epler et al. | 437/129 |
| 4,827,483 | 5/1989 | Fukuzawa et al. | 372/45 |
| 4,871,690 | 10/1989 | Holonyak, Jr. et al. | 437/173 |
| 4,933,301 | 6/1990 | Scifres et al. | 437/129 |

FOREIGN PATENT DOCUMENTS 0236184 10/1986 Japan .................................. 372/46

OTHER PUBLICATIONS

Meehan et al., "Disorder of ... Superlattice by Donor Diffusion," Appl. Phys. Lett., 45(5), 1 Sep. 1984, pp. 549–551.
Hirayama et al., "Ion Species Dependence ... GaAs-AlAr Superlattices," Jap. J. of Applied Physics, pp. 1498–1502 (1985).
Cibert et al., "Kinetics of Implantation Enhanced ... of GaAs-Ga$_x$As Interfaces," Applied Phys. Letters, 49(4), pp. 223–225 (1986).
Elman et al., "GaAs/AlGaAs quantum-well ... rapid thermal Annealing", J. of Appl. Physics, 66(5), pp. 2104–2107 (1989).
Welch et al., "Buried heterostructure lasers ... impurity induced disordering," Appl. Phys. Lett., 51(18), pp. 1401–1403 (1987).
Ribot et al., "Disordering of GaAs/AlGaAs multiple well structures ... laser and phase modulates," Appl. Phys. lett., 55(7), pp. 672–674 (1989).
Deppe et al., "Stripe-geometry quantum well ... lasers defined by defect diffusion," Appl. Phys. Lett., 49(9), pp. 510–512 (1986).

Primary Examiner—Olik Chaudhuri
Assistant Examiner—Ramamohan Rao
Attorney, Agent, or Firm—Victor F. Lohmann, III

[57] ABSTRACT

A method of selectively tuning the bandedge of a semiconductor heterostructure includes forming a disordered region which is spatially separated from a quantum well active region, and subsequently annealing the heterostructure so that vacancies/defects in the disordered region diffuse into the quantum well region and enhance interdiffusion at the well-barrier heterojunctions. The tuning is spatially selective when the heterostructure is masked so that exposed portions correspond to regions where bandgap tuning is desirable. The heterostructures of interest are III-V material systems, such as AlGaAs/GaAs, where the active region includes structures such as a single quantum well, a multiple quantum well, or a superlattice.

14 Claims, 5 Drawing Sheets

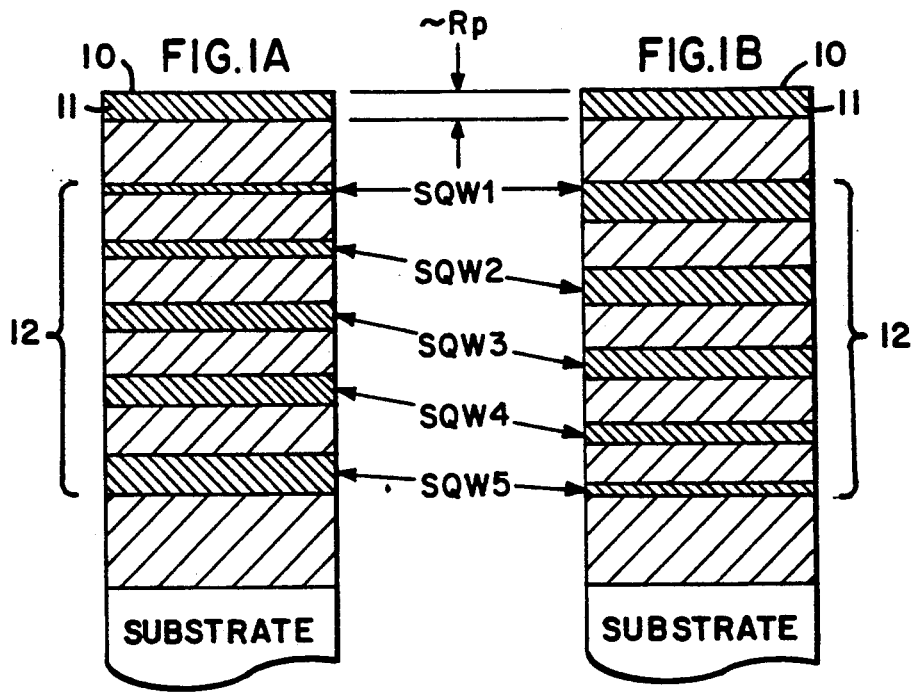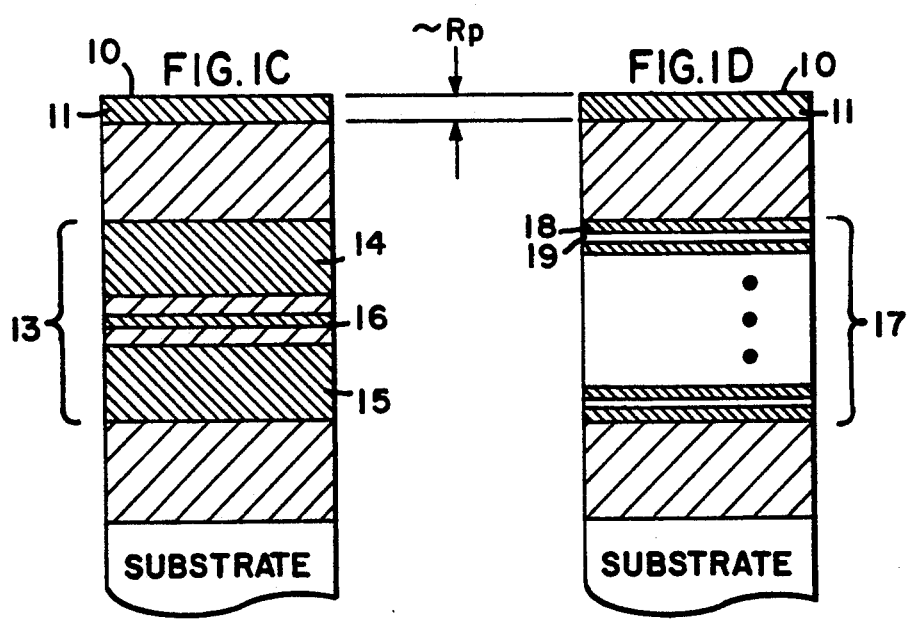

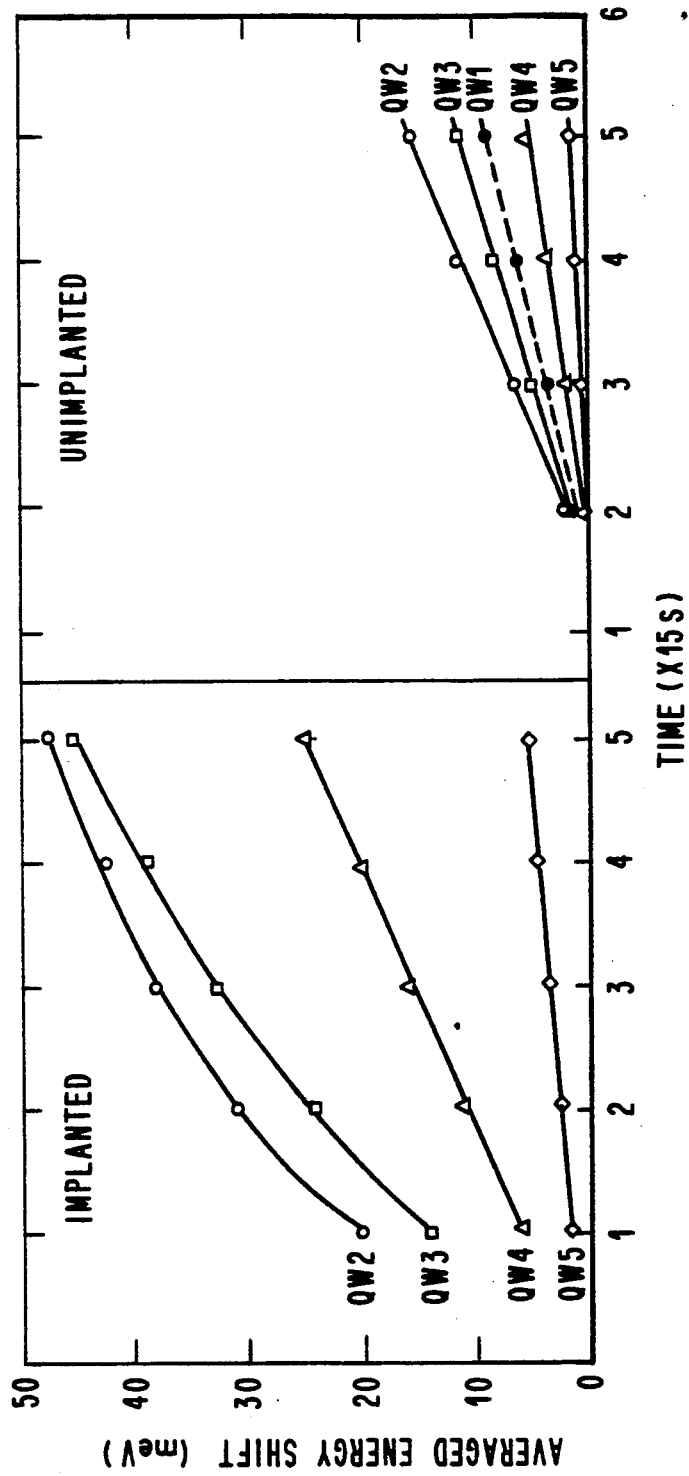

BANDGAP TUNING OF SEMICONDUCTOR QUANTUM WELL STRUCTURES

This is a continuation of copending application(s) Ser. No. 07/444,502 filed on Nov. 30, 1989 now abandoned.

FIELD OF THE INVENTION

This invention pertains to semiconductor heterostructures and, more specifically, to a method of bandgap tuning of a quantum well structure.

BACKGROUND OF THE INVENTION

Optical and electrical properties of quantum well structures are of great importance for novel semiconductor device applications. The ultimate goal of monolithic integration of optical, optoelectronic and electronic components requires the capability for controllable lateral and vertical modifications of optical constants and electrical characteristics in such components. The selective intermixing of group III atoms across heterostructure interfaces, especially in GaAs/AlGaAs quantum well structures, has been extensively studied due to the controllable changes in optical bandgap which accompany well-barrier interdiffusion.

Impurity-induced compositional disordering (IICD) is a well known technique for enhancing interdiffusion. It has been successfully applied to the fabrication of superlattice and quantum well heterostructure devices. In particular, IICD has been demonstrated in a variety of structures by using a diffusion process, and also by using ion implantation followed by thermal annealing. Experimental results have shown that ion implantation is a suitable technique for introducing many kinds of impurities into quantum well structures to enhance interdiffusion.

In conventional ion implantation intermixing techniques, the range profile of relevance to intermixing is always considered to be the range for energy losses to nuclear damage processes, and the enhancement of interdiffusion is always associated with the presence of implantation induced defects and/or impurities. The mass and energy of the implanted ions are always chosen such that the impurities/damage distribution are spatially peaked in the region of interest for intermixing, such as the middle of a multiple quantum well or a superlattice structure.

Holonyak in U.S. Pat. No. 4,511,408 discloses a method for disordering the layers in a III-V heterostructure by implanting ions directly into the sample (region of intermixing) and then subjecting the sample to thermal annealing. As noted in column 4, lines 30-34, the implantation causes considerable crystal damage in the structure, which in this case was a superlattice. The above method for enhancing interdiffusion at heterointerfaces is also disclosed by Hirayama et al. in "Ion-Species Dependence of Interdiffusion in Ion-Implanted GaAs-AlAs Superlattices", Japanese Journal of Applied Physics, 24, pp. 1498-1502 (1985), and by Cibert et al. in "Kinetics of Implantation Enhanced Interdiffusion of Ga and Al at GaAs—$Ga_xAl_{1-x}As$ Interfaces", Applied Physics Letters, As Interfaces", Applied Physics Letters, 49(4), pp. 223-225 (1986).

Hirayama et al. implanted a group of samples containing superlattices with a variety of ion species and then measured the photoluminescence peak shifts while the samples were being annealed. As in Holonyak, the ions were implanted directly into the superlattice structure, causing crystal damage in the region of intermixing which required thermal treatment to effect recovery. Hirayama et al. observed that the spectral width of the superlattice structure increased after annealing, and explained that the increase is partly due to the inhomogeneity of the interdiffusion resulting from the inhomogeneous depth profile of implanted impurity density. Cibert et al. presented spectral measurements of a GaAs quantum well structure implanted with Gallium ions and subsequently annealed. Disadvantageously, the implantation caused damage centered on the quantum well and extending deep into the barriers. In fact, the maximum damage from one of the higher ion doses was almost enough to produce amorphization.

OBJECTS OF THE INVENTION

It is a primary object of the present invention to obviate the above-noted and other disadvantages of the prior art.

It is a further object of the present invention to provide a method of controllably tuning the optical bandgap of a semiconductor heterostructure by enhancing atomic interdiffusion at the heterojunctions.

It is a further object of the present invention to provide a method of performing spatially selective bandgap tuning in a quantum well heterostructure so that laterally isolated conducting areas are simultaneously produced.

It is a yet further object of the present invention to perform homogeneous interdiffusion in a quantum well heterostructure using ion implantation followed by thermal annealing wherein said implantation does not cause crystal damage in the region where the interdiffusion is taking place.

SUMMARY OF THE INVENTION

In one aspect of the invention, a method of selectively tuning the bandedge in a quantum well heterostructure includes implanting ions into said heterostructure to form a disordered region near the upper surface of the sample. The vacancies and defects created by said implantation step are spatially separated from the quantum well active region. The heterostructure is then thermally annealed so that the vacancies diffuse through the active region (quantum wells) and enhance interdiffusion at the heterojunctions, thereby modifying the optical bandgap of the quantum well layers. The bandgap tuning is selective because the implantation step can be appropriately controlled.

The above tuning method can also be used to perform spatially selective bandgap tuning while simultaneously providing laterally isolated conducting areas. To effect this spatial selectivity, the heterostructure is masked in accordance with a specified pattern so that unmasked portions correspond to designated regions of said structure where bandgap tuning/appreciable conductivity is desirable. The patterned structure is ion implanted and thermally annealed as described above whereby the unmasked regions are tuned. When the ions are electrically active, enhanced interdiffusion and activation of ions occur simultaneously during annealing.

The novel tuning method can be implemented to fabricate a bandgap tunable semiconductor heterostructure where the active region consists of a quantum well structure such as a single quantum well (SQW), a multiple quantum well (a number of isolated SQWs), or a superlattice (a number of coupled SQWs).

BRIEF DESCRIPTION OF THE DRAWINGS

FIGS. 1A and 1B are lateral views of heterostructure devices which were tuned in accordance with the present invention and which include a multiplicity of quantum well layers grown in standard and reverse order, respectively;

FIG. 1C is a lateral view of a double heterostructure semiconductor waveguide where the bandgap of the single quantum well layer was tuned in accordance with the present invention;

FIG. 1D is a lateral view of a multiple quantum well (MQW) waveguide where the bandgap of each quantum well layer and subsequently the waveguide as a whole were tuned in accordance with the present invention;

FIG. 6A shows the energy shift versus annealing time (in increments of 15s) for each of the single quantum well layers in the heterostructure of FIG. 1A; and FIG. 6B plots energy shift versus annealing time for each of the single quantum well layers in a heterostructure similar to that in FIG. 1A but without the ion implantation step.

DETAILED DESCRIPTION OF THE PREFERRED EMBODIMENT

Figure 2:
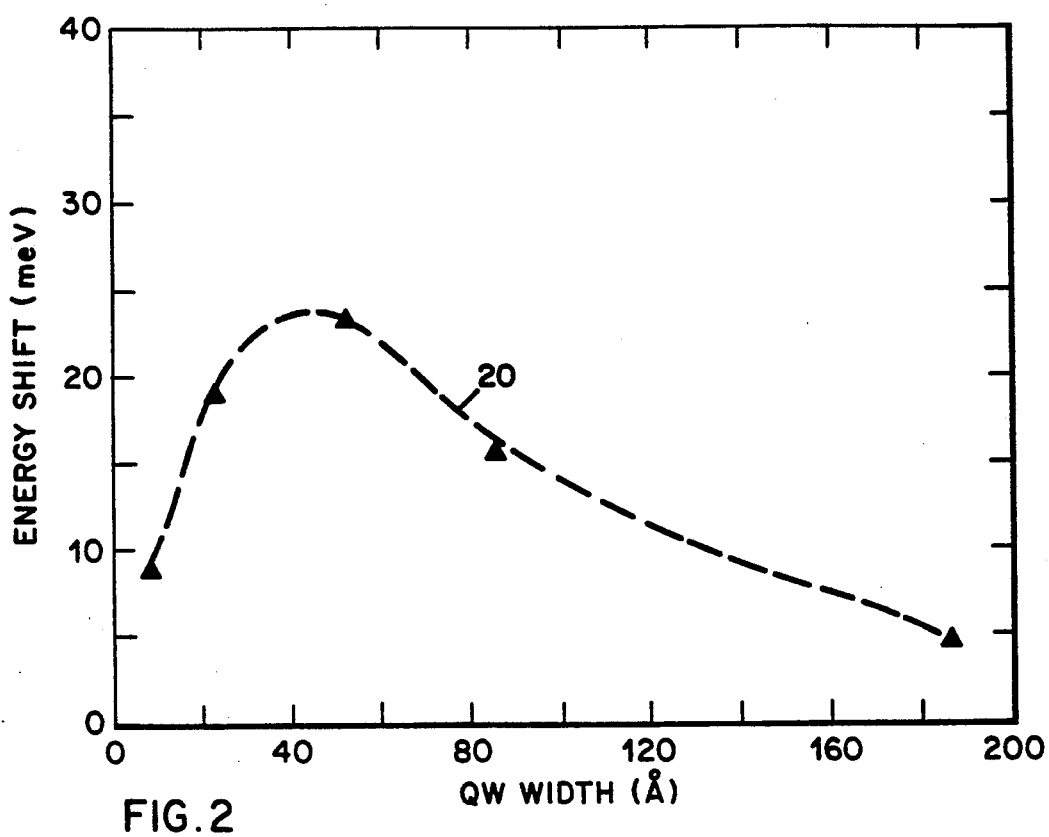
FIG. 2 graphically illustrates the dependence of photoluminescence (PL) energy shifts on quantum well width for the structure in FIG. 1A.

The present application discloses a novel method for bandedge tuning in III-V semiconductor material systems by controlling the level of atomic interdiffusion at heterointerfaces of the system. The material systems of interest are semiconductor heterostructures having a quantum well structure as an active or part of an active region, and include such devices as a laser, detector, amplifier, modulator waveguide, etc.

In accordance with the tuning method of the present invention, a heterostructure to be tuned is first implanted with low energy ions and then subjected to thermal annealing. The implantation creates a disordered region near the upper surface of the heterostructure wherein the vacancies and defects are spatially separated from the quantum well region, thus ensuring that no damage will occur to the active region. Following ion implantation, the heterostructure is thermally annealed so that the vacancies diffuse into the quantum well structure and enhance the intermixing between atoms at the heterointerfaces.

The result of this interdiffusion is modification of the shape of the quantum well layers with a corresponding change in their ground state energy levels. Controlling the parameters of the ion implantation and thermal annealing steps effectively permits one to tune the bandgap of the quantum well layers. The following discussion presents several samples which were tuned in accordance with the novel method disclosed herein.

The samples in FIGS. 1A–1D were grown by molecular beam epitaxy in a RIBER 2300 system, and include a quantum well active region with alternating layers of a GaAs host material and an AlGaAs barrier material. Although a GaAs/AlGaAs system was investigated, it should be well known to those skilled in the art that other quantum well structures having different compounds would be capable of being tuned in accordance with the present invention. Ion beam implantation was performed using 35 keV $^{75}$As$^+$ ions having a fluence range of between $5 \times 10^{13}$ cm$^{-2}$ and $5 \times 10^{15}$ cm$^{-2}$. The samples were masked prior to implantation so that only half of each piece was implanted, allowing a direct comparison between the respective bandgap changes in the implanted and unimplanted areas. Following implantation, rapid thermal annealing (RTA) was performed at 950° C. using the enhanced overpressure proximity technique described by Armiento et al. in Appl. Phys. Lett., Vol. 48, p. 1623 (1986). The samples were then mounted strain-free in a cryostat and cooled to 5K. Photoluminescence (PL) and photoluminescence excitation (PLE) spectroscopies were used to monitor the excitonic energies. Room temperature transmission measurements were done on the MQW samples.

The heterostructures in FIGS. 1A and 1B consist of a quantum well active region 12 having a series of single quantum well layers labeled SQW1–SQW5 grown in standard and reverse order, respectively. The well layers are uncoupled and of varying widths, with the layer SQW1 in each active region being located approximately 300 nm below the upper surface 10. A barrier layer separates adjacent quantum well layers from one another. For these samples, the barrier material was AlGaAs and the well layers were GaAs. In accordance with the implantation step of the novel tuning method, surface 10 is implanted with a low energy ion beam to create a disordered region 11 of depth R$_p$ (penetration depth of ions). As indicated, the region 11 is spatially separated from the nearest quantum well layer SQW1, thereby preventing the defects created by ion implantation from damaging the active region 12. Consequently, the material quality of the well layers is preserved. After implantation, thermal annealing is performed to enhance the interdiffusion at the well-barrier heterojunctions.

The structure in FIG. 1C is a simple double heterostructure waveguide 13 with a 4 nm-wide control single quantum well layer 16 in the middle of 1.2$\mu$ of GaAs. FIG. 1D shows a multiple quantum well waveguide 17 consisting of twenty-five periods of 8 nm GaAs single quantum well layers 18 separated by 8 nm of Al$_{0.3}$Ga$_{0.7}$As barriers 19. In accordance with the tuning method, the upper surface 10 in each of FIGS. 1C and 1D was ion implanted to create a disordered region 11 of depth R$_p$. Significantly, as in FIGS. 1A and 1B, the disordered region 11 in both FIGS. 1C and 1D is spatially separated from its respective active region.

The particular structures in the above discussion of FIGS. 1A–1D are for illustrative purposes only, and should not serve to limit application of the novel tuning method to only these heterostructure devices. It should be apparent to those skilled in the art that other heterostructures containing quantum wells in the active region could be similarly tuned. An important aspect of the novel tuning method is that the ion implantation and thermal annealing steps are independently controllable processes which allow a designer to selectively tune the bandedge of a device under investigation. For example, the fluence level of the implanting ion beam and the duration of the thermal treatment are controllable parameters in their respective processes. The variations in bandgap as a function of the quantum well thickness and the fluence level are shown graphically in FIGS. 2-5, while the effect of annealing time on the change in bandgap is illustrated in FIG. 6. The following discussion of FIGS. 2-6 will focus on the measured energy shifts of the tuned structures in FIGS. 1A-1D and will illustrate the selective tuning which is possible due to the present invention.

FIG. 2 graphically illustrates the variation of energy shift as a function of quantum well width for the sample in FIG. 1A when a fluence level of $1 \times 10^{15}$ cm$^{-2}$ was used. As shown by curve 20, the maximum shift occurs for a quantum well layer with a width of approximately 4 nm. A similar curve was observed for the structure in FIG. 1B, even though the well layers were grown in reverse order to those of FIG. 1A.

Figure 3:
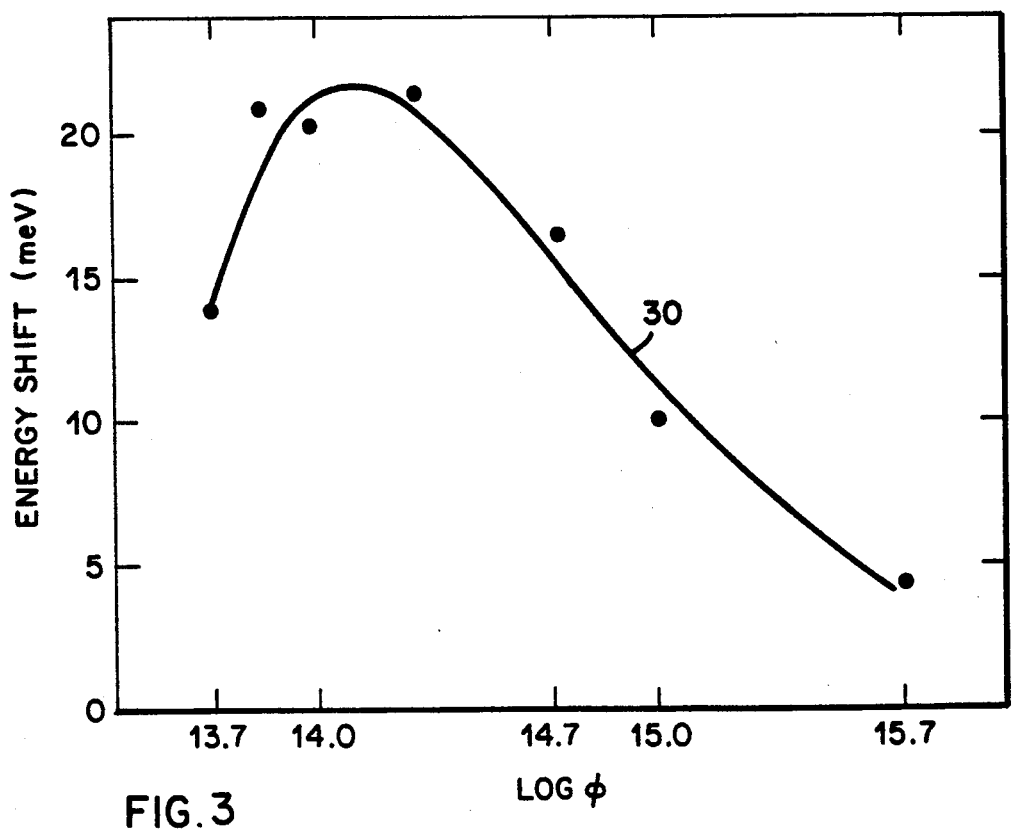
FIG. 3 graphically illustrates the functional relationship between energy shift and implant fluence for the structure in FIG. 1C.
Figure 4:
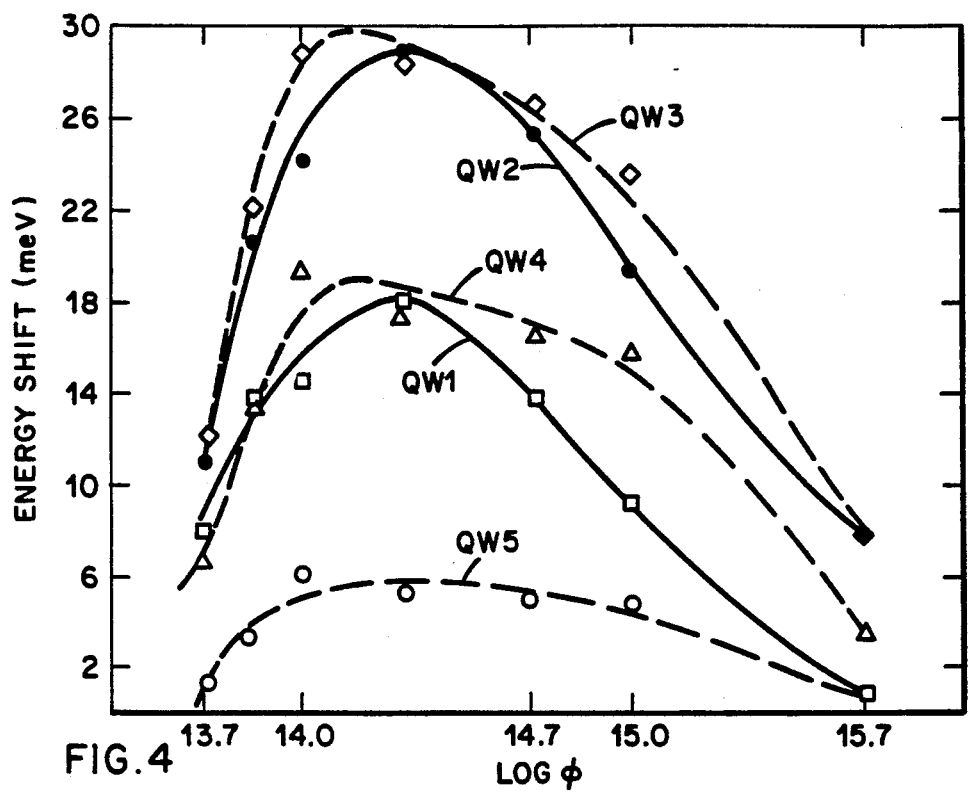
FIG. 4 is a graph of the energy shift versus fluence level for each of the single quantum well layers in FIG. 1A.

FIG. 3 shows the dependence of energy shift on fluence level for the double heterostructure waveguide in FIG. 1C, where Log $\phi$ is a measure of the fluence level of the ion beam used for implantation. The logarithmic axis represents a range of fluence values between $5 \times 10^{13}$ cm$^{-2}$ and $5 \times 10^{15}$ cm$^{-2}$. The functional relationship described by curve 30 is also illustrated in FIG. 4 as a set of characteristic curves for the structure in FIG. 1A wherein each curve is labeled with the particular quantum well (QW) layer to which it corresponds. For example, the test results of layer SQW1 are presented as curve QW1. A similar set of curves (not shown) was observed for the structure in FIG. 1B. As shown in FIG. 4, the maximum energy shift for each quantum well layer occurs at approximately the same fluence level, regardless of layer width.

The importance of FIGS. 3 and 4 is that the dependence of energy shift on the fluence of implantation as a controllable parameter provides the designer with a range of achievable bandgap values from which the designer can select a desired bandgap and then tune the structure accordingly by using the appropriate fluence level during implantation. For example, a designer wishing to tune a single quantum well layer having the same width as layer SQW1 in FIG. 1A could choose from one of the possible energy shifts represented by curve QW1 in FIG. 4 and then match this value with its corresponding fluence level on the log $\phi$ axis. The implantation step would use this fluency to achieve the desired bandgap.

Figure 5A:
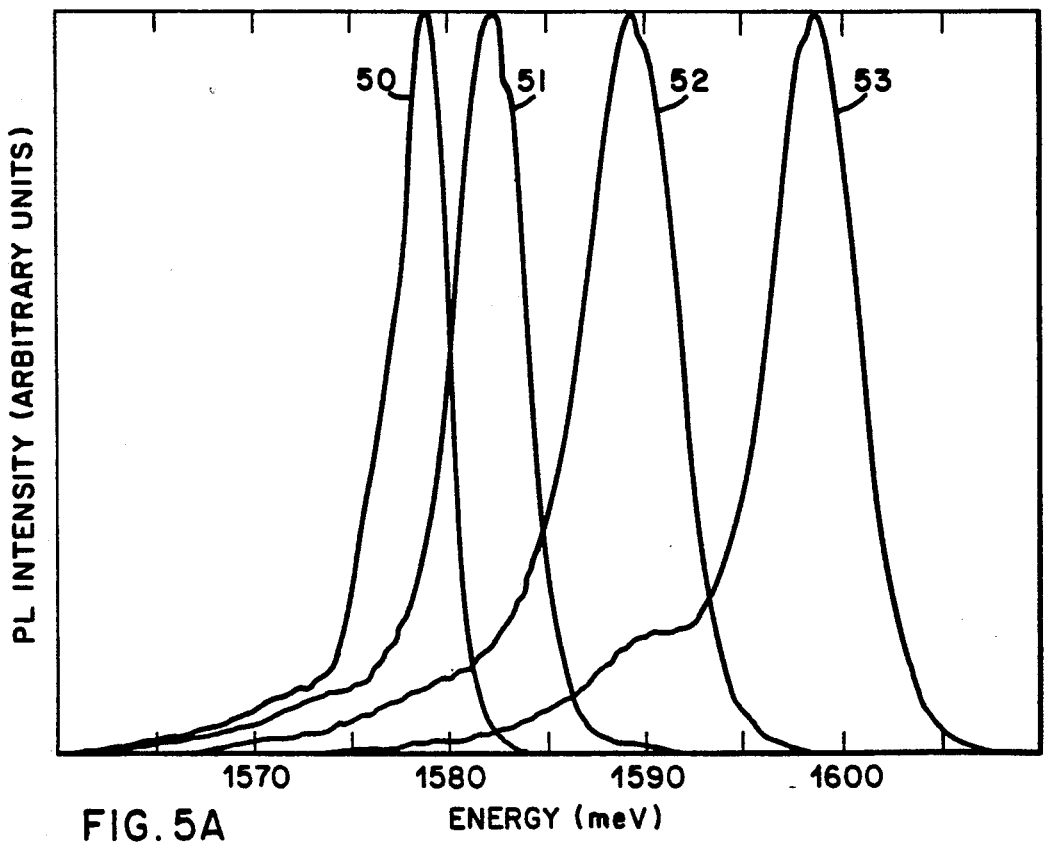
FIG. 5A is a graph which plots photoluminescence intensity and energy position at low temperature for an unimplanted multiple quantum well structure and for the MQW structure in FIG. 1D with implantation at three different fluence levels.
Figure 5B:
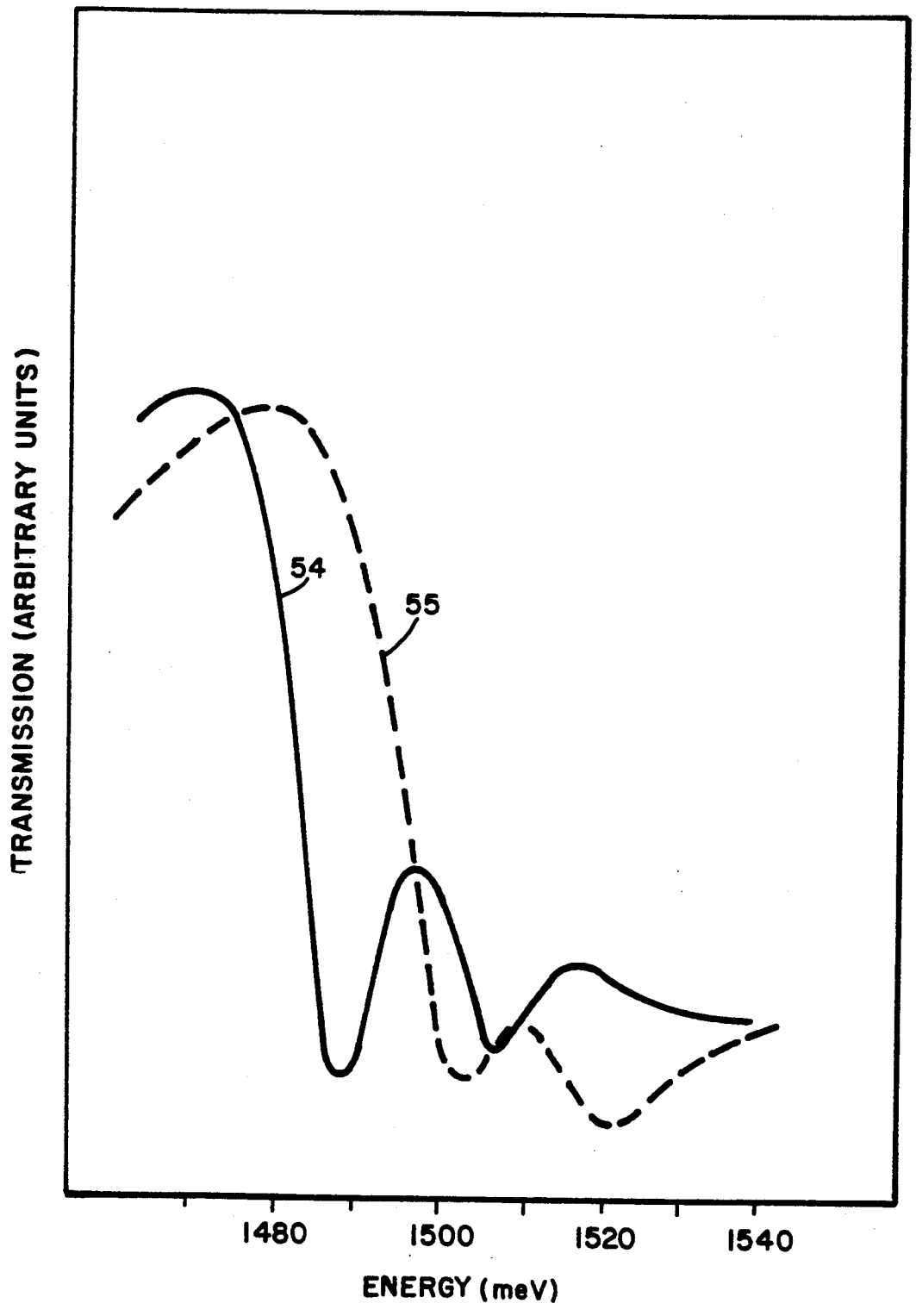
FIG. 5B is a graph which plots optical transmission and energy position at room temperature for an unimplanted MQW structure and for the MQW structure in FIG. 1D with an implantation fluence of $\phi = 1 \times 10^{14}$ cm$^{-2}$.

A significant achievement of the novel tuning method concerns the fairly uniform interdiffusion which occurs at all depths of the quantum well active region during thermal annealing. To examine the depth uniformity of the interdiffusion process, PL spectral data was gathered from four samples of multiple quantum well (MQW) waveguides similar to that in FIG. 1D and is displayed graphically in FIG. 5A. Curves 51, 52, and 53 represent the intensity level of three MQW structures tuned in accordance with the present invention wherein the samples were implanted at fluence levels of $5 \times 10^{13}$, $2 \times 10^{14}$, and $10^{15}$, respectively, and then subjected to thermal annealing to effect the interdiffusion at the wellbarrier heterojunctions. The PL intensity of a conventional MQW structure at low temperature is shown as curve 50. The PLE data for these curves confirmed that the peaks in FIG. 5A are due to intrinsic excitonic transitions. The importance of FIG. 5A is that broadening of the PL peaks is insignificant compared with the observed energy shifts. This is also confirmed by the room temperature transmission data shown in FIG. 5B which is consistent with the data shown in FIG. 5A. Thus, the interdiffusion at the heterointerfaces of each well-barrier layer pair is fairly uniform throughout the quantum well active region.

FIG. 6A illustrates the effect of annealing time on the change in bandgap for the tuned heterostructure in FIG. 1A. FIG. 6B has been provided for comparison purposes to show the change in bandgap of a heterostructure similar to that in FIG. 1A except that the implantation step is not performed. As indicated in both FIGS. 6A and 6B, the measured energy shift in the bandgap of a quantum well layer is directly proportional to the amount of annealing time. However, FIG. 6A clearly shows that a wider range of bandgap values is possible for all layer widths when the heterostructure is implanted and thermally treated in accordance with the present invention. Advantageously, the designer can selectively tune a particular quantum well layer to a desired bandgap value since the annealing time is a controllable parameter.

Although the above discussion of the novel tuning method has been concerned with tuning a single active region containing quantum wells, the present invention can also be used to tune a group of quantum well regions in a spatially selective manner. The spatial selection is effected by masking a heterostructure in accordance with a specified pattern so that the unmasked portions correspond to designated regions of the structure where tuning is desirable. During subsequent ion implantation, disordered regions are only formed in the unmasked areas. As was the case with the tuning of a single active region, the vacancies and defects in each disordered region are spatially separated from their respective quantum well regions. Thermal treatment of the heterostructure causes enhanced interdiffusion to occur in only the quantum well regions of the unmasked areas. Thus, the tuning is spatially selective according to the masking pattern. When electrically active ions are used for implantation, the subsequent thermal annealing results in simultaneous activation of the dopants and enhanced interdiffusion. This feature can be used in the fabrication of laterally isolated conducting areas with promising device application. For example, p-type and n-type dopants would be useful in fabricating optical and electronic components, respectively.

What has been shown and described herein is a novel tuning method which permits accurate and precise modification of the structural parameters of semiconductor quantum well shapes (geometrical shapes and widths, barrier heights and composition in the well) in a spatially selective manner. These modifications result in controllable tuning of the resonant absorption (optical bandgap) energies (wavelengths) of the semiconductor structure. Advantageously, the method will allow monolithic integration of optical, optoelectronic and electronic components on a single semiconductor wafer. Furthermore, the implantation step does not cause crystal damage in the quantum well region due to the spatial separation of the disordered region, and the annealing step produces homogeneous interdiffusion at the heterojunctions so that spectral widening does not accompany the shift in optical bandgap.

What is claimed is:

1. A method of processing a semiconductor heterostructure having a single quantum well structure as an active region, wherein a cladding layer is deposited on said single quantum well structure, comprising the steps of:

forming a disordered region in said cladding layer wherein said disordered region is spatially separated from said quantum well structure; and thermally annealing said semiconductor heterostructure so that vacancies/defects in said disordered region are caused to diffuse through said quantum well structure and enhance intermixing of atoms at heterojunctions of said quantum well structure;

whereby the single quantum well structure still existing after said annealing step exhibits a changed bandgap characteristic.

2. The method of selectively tuning the bandedge of a semiconductor heterostructure as recited in claim 1 wherein the step of forming a disordered region includes the step of:

implanting ions into said cladding layer to create said disordered region.

3. A method of processing a semiconductor heterostructure having a multiple quantum well structure as an active region, wherein a cladding layer is deposited on said single quantum well structure, comprising the steps of:

forming a disordered region in said cladding layer wherein said disordered region is spatially separated from said multiple quantum well structure; and thermally annealing said semiconductor heterostructure so that vacancies/defects in said disordered region are caused to diffuse through said quantum well structure and enhance intermixing of atoms at heterojunctions of said multiple quantum well structure;

whereby the single quantum well structure still existing after said annealing step exhibits a changed bandgap characteristic.

4. The method of selectively tuning the bandedge of a semiconductor heterostructure as recited in claim 3 wherein the step of forming a disordered region includes the step of:

implanting ions into said cladding layer to create said disordered region.

5. A method of processing a semiconductor heterostructure having a single quantum well structure as an active region, wherein a cladding layer is deposited on said single quantum well structure, comprising the steps of:

masking said heterostructure in accordance with a specified pattern so that unmasked portions correspond to designated substructures of said single quantum well structure where bandgap modification is desirable;

in each designated substructure, forming a disordered region that is spatially separated from the portion of said single quantum well structure located within said respective designated substructure; and thermally annealing said heterostructure so that vacancies/defects in said disordered region are caused to diffuse through the respective portion of said single quantum well structure and enhance intermixing of atoms at the heterojunctions of said corresponding designated substructure;

whereby the single quantum well structure still existing after said annealing step exhibits a changed bandgap characteristic.

6. The method of performing spatially selective bandgap tuning as recited in claim 5 wherein the step of forming a disordered region includes the step of:

implanting ions into each of said designated substructures to form said corresponding disordered regions.

7. The method of performing spatially selective bandgap tuning as recited in claim 6 wherein:

certain ones of said designated substructures are implanted with electrically active ions so that said step of thermal annealing causes simultaneous activation of said ions and enhanced interdiffusion.

8. A method of processing a semiconductor heterostructure having a multiple quantum well structure as an active region, wherein a cladding layer is deposited on said multiple quantum well structure, comprising the steps of:

masking said heterostructure in accordance with a specified pattern so that unmasked portions correspond to designated substructures of said single quantum well structure where bandgap modification is desirable;

in each designated substructure, forming a disordered region that is spatially separated from the portion of said quantum well structure located within said respective designated substructure; and thermally annealing said heterostructure so that vacancies/defects in said disordered region are caused to diffuse through the respective portion of said quantum well structure and enhance intermixing of atoms at heterojunctions of said multiple quantum well structure;

whereby the multiple quantum well structure still existing after said annealing step exhibits a changed bandgap characteristic.

9. The method of performing spatially selective bandgap tuning as recited in claim 8 wherein the step of forming a disordered region includes the step of:

implanting ions into each of said designated substructures to form said corresponding disordered region.

10. The method of performing spatially selective bandgap tuning as recited in claim 9 wherein:

certain ones of said designated substructures are implanted with electrically active ions so that said step of thermal annealing causes simultaneous activation of said ions and enhanced interdiffusion.

11. The method of changing the bandedge of a semiconductor heterostructure as recited in claim 1 further includes the step of:

prior to the formation of said disordered region, selecting an appropriate set of disordering parameters which can control the formation of said disordered region and selecting an appropriate set of annealing parameters which control the thermal annealing of said heterostructure;

whereby the bandedge of said modified quantum well structure is tuned to a desired bandgap characteristic in accordance with said selected disordering and annealing parameters.

12. The method of changing the bandedge of a semiconductor heterostructure as recited in claim 3 further includes the step of:

prior to the formation of said disordered region, selecting an appropriate set of disordering parameters which control the formation of said disordered region and selecting an appropriate set of annealing parameters which control the thermal annealing of said heterostructure;

whereby the bandedge of said modified quantum well structure is tuned to a desired bandgap characteristic in accordance with said selected disordering and annealing parameters.

13. The method of changing the bandedge of a semiconductor heterostructure as recited in claim 5 further includes the step of:

prior to the formation of said disordered region, selecting an appropriate set of disordering parameters which control the formation of said disordered region and selecting an appropriate set of annealing parameters which control the thermal annealing of said heterostructure;

whereby the bandedge of said modified quantum well structure is tuned to a desired bandgap characteristic in accordance with said selected disordering and annealing parameters.

14. The method of changing the bandedge of a semiconductor heterostructure as recited in claim 8 further includes the step of:

prior to the formation of said disordered region, selecting an appropriate set of disordering parameters which control the formation of said disordered region and selecting an appropriate set of annealing parameters which control the thermal annealing of said heterostructure;

whereby the bandedge of said modified quantum well structure is tuned to a desired bandgap characteristic in accordance with said selected disordering and annealing parameters.

* * * * *